(12) United States Patent
Larsen

(10) Patent No.: US 6,362,946 B1
(45) Date of Patent: Mar. 26, 2002

(54) ELECTROSTATIC WAFER CLAMP HAVING ELECTROSTATIC SEAL FOR RETAINING GAS

(75) Inventor: Grant Kenji Larsen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/431,837

(22) Filed: Nov. 2, 1999

(51) Int. Cl.⁷ ............................................. H02N 13/00
(52) U.S. Cl. ..................................................... 361/234
(58) Field of Search ........................ 361/234; 118/724

(56) References Cited

U.S. PATENT DOCUMENTS

| | | | |
|---|---|---|---|
| 3,993,509 A | 11/1976 | McGinty | 148/1.5 |
| 4,115,036 A | 9/1978 | Paterson | |
| 4,184,188 A | 1/1980 | Briglia | 361/234 |
| 4,384,918 A | 5/1983 | Abe | 156/643 |
| 4,412,133 A | 10/1983 | Eckes et al. | 250/492.2 |
| 4,457,359 A | 7/1984 | Holden | 165/80 |
| 4,480,284 A | 10/1984 | Tojo et al. | 361/234 |
| 4,502,094 A | 2/1985 | Lewin et al. | 361/234 |
| 4,520,421 A | 5/1985 | Sakitani et al. | 361/234 |
| 4,554,611 A | 11/1985 | Lewin | 361/234 |
| 4,603,466 A | 8/1986 | Morley | 29/569 R |
| 4,645,218 A | 2/1987 | Ooshio et al. | 361/234 |
| 4,665,463 A | 5/1987 | Ward et al. | 361/234 |
| 4,692,836 A | 9/1987 | Suzuki | 361/234 |
| 4,724,510 A | 2/1988 | Wicker et al. | 361/234 |
| 4,832,781 A | 5/1989 | Mears | 156/345 |
| 4,938,992 A | 7/1990 | Mears | 427/38 |
| 5,103,367 A | 4/1992 | Horwitz et al. | 361/234 |
| 5,166,856 A | 11/1992 | Liporace et al. | 361/233 |
| 5,179,498 A | 1/1993 | Hongoh et al. | 361/234 |
| 5,184,398 A | 2/1993 | Moslehi | 29/825 |

(List continued on next page.)

FOREIGN PATENT DOCUMENTS

| | | |
|---|---|---|
| DE | 3007001 A1 | 9/1981 |
| EP | 0134614 | 3/1985 |
| EP | 0482205 A1 | 4/1992 |
| EP | 0552877 A1 | 7/1993 |
| EP | 0 639 771 A1 | 1/1996 |
| EP | 0701319 A1 | 3/1996 |
| EP | 0783 175 A2 | 7/1996 |
| EP | 0779436 A2 | 6/1997 |
| EP | 0780 885 A2 | 6/1997 |
| EP | 0 806 793 A2 | 11/1997 |
| EP | 0 806 798 A2 | 11/1997 |
| JP | 53027103 | 3/1978 |
| JP | 4(1992)-132239 | 5/1992 |
| JP | 4-371579 | 12/1992 |

OTHER PUBLICATIONS

Wardly, George A., "Electrostatic Wafer Chuck for Electron Beam Microfabrication". Rev. Sci. Instrum., vol. 44, No. 10, Oct. 1973, pp. 15–6–1509.

Primary Examiner—Fritz Fleming
(74) Attorney, Agent, or Firm—Wolf, Greenfield & Sacks, P.C.

(57) ABSTRACT

Methods and apparatus are provided for holding a workpiece, such as a semiconductor wafer, during processing. The apparatus includes a platen assembly, a gas source and voltage source. The platen assembly includes a dielectric element that defines an electrically insulating clamping surface for receiving a workpiece and electrodes underlying the clamping surface. The electrodes include sealing electrodes at or near a periphery of the clamping surface. The gas source provides a gas in a region between the workpiece and the clamping surface for conducting thermal energy between the workpiece and the clamping surface. The voltage source applies sealing voltages to the sealing electrodes for producing an inwardly moving wave in the workpiece. Gas is transported inwardly away from the periphery of the clamping surface by the inwardly moving wave. The sealing electrodes may have the form of concentric rings at or near the periphery of the clamping surface.

34 Claims, 15 Drawing Sheets

U.S. PATENT DOCUMENTS

| | | | |
|---|---|---|---|
| 5,267,607 A | 12/1993 | Wada | |
| 5,275,683 A | 1/1994 | Arami et al. | 156/345 |
| 5,315,473 A | 5/1994 | Collins et al. | 361/234 |
| 5,325,261 A | 6/1994 | Horwitz | |
| 5,345,999 A | 9/1994 | Hosokawa | 165/80.2 |
| 5,384,682 A | 1/1995 | Watanabe et al. | 361/234 |
| 5,436,790 A | 7/1995 | Blake et al. | 361/234 |
| 5,444,597 A | 8/1995 | Blake et al. | 361/234 |
| 5,452,177 A | 9/1995 | Frutiger | 361/234 |
| 5,460,684 A | 10/1995 | Saeki et al. | 156/345 |
| 5,474,614 A | 12/1995 | Robbins | 118/728 |
| 5,528,451 A | 6/1996 | Su | 361/234 |
| 5,535,090 A | 7/1996 | Sherman | 361/234 |
| 5,535,507 A * | 7/1996 | Barnes et al. | 29/825 |
| 5,560,780 A | 10/1996 | Wu et al. | 361/234 |
| 5,583,736 A | 12/1996 | Anderson et al. | 361/234 |
| 5,606,485 A | 2/1997 | Shamouilian et al. | 361/234 |
| 5,612,850 A | 3/1997 | Birang et al. | 361/234 |
| 5,631,803 A | 5/1997 | Cameron et al. | 361/234 |
| 5,634,266 A | 6/1997 | Sherstinsky et al. | 29/825 |
| 5,636,098 A | 6/1997 | Salfelder et al. | 361/234 |
| 5,644,467 A | 7/1997 | Steger et al. | 361/234 |
| 5,646,814 A | 7/1997 | Shamouilian et al. | 361/234 |
| 5,754,391 A | 5/1998 | Bates | 361/234 |
| 5,812,362 A | 9/1998 | Ravi | 361/234 |
| 5,822,172 A * | 10/1998 | White | 361/234 |
| 5,880,923 A * | 3/1999 | Hausmann | 361/234 |
| 5,969,934 A | 10/1999 | Larsen | 361/234 |
| 6,023,405 A * | 2/2000 | Shamouilian | 361/234 |

* cited by examiner

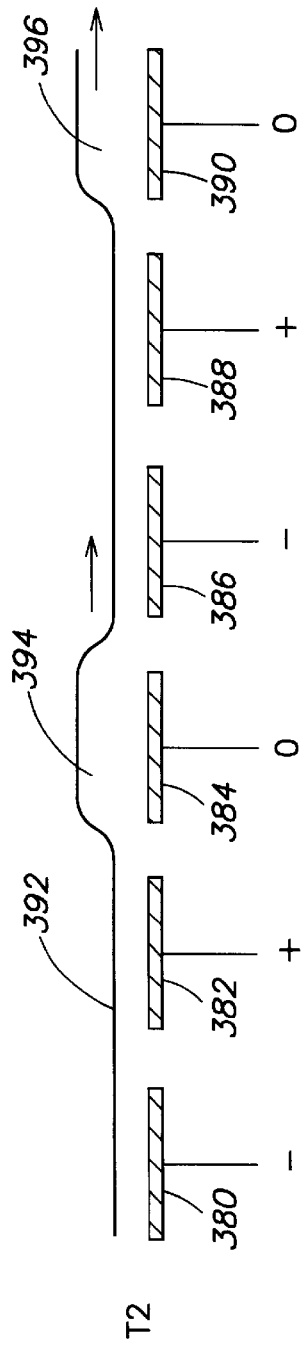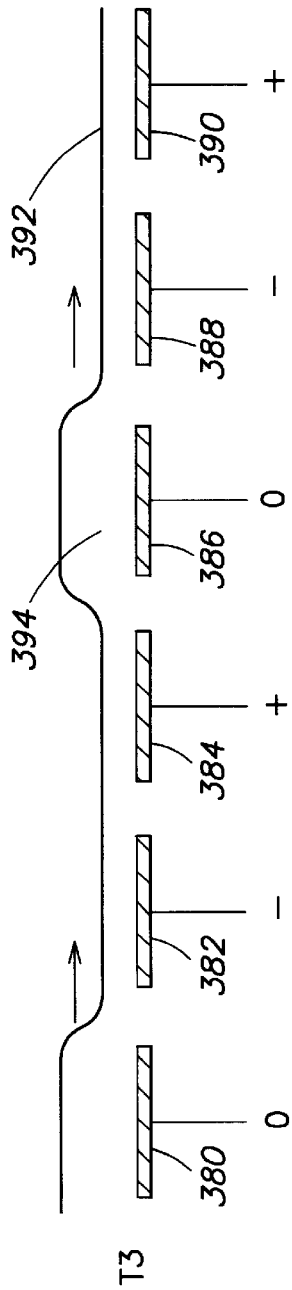

ELECTROSTATIC WAFER CLAMP HAVING ELECTROSTATIC SEAL FOR RETAINING GAS

FIELD OF THE INVENTION

This invention relates to apparatus for electrostatic clamping of workpieces, such as semiconductor wafers, in a vacuum processing chamber and, more particularly, to electrostatic clamping apparatus which includes an electrostatic seal for retaining a gas between the workpiece and a clamping surface. The apparatus is particularly useful in ion implantation systems, but is not limited to such use.

BACKGROUND OF THE INVENTION

In the fabrication of integrated circuits, a number of well-established processes involve the application of ion beams to semiconductor wafers in vacuum. These processes include, for example, ion implantation, ion beam milling and reactive ion etching. In each instance, a beam of ions is generated in a source and is directed with varying degrees of acceleration toward a target wafer. Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded in the crystalline lattice of the semiconductor material to form a region of desired conductivity.

The wafer mounting site is a critical part of an ion implantation system. The wafer mounting site is required to firmly clamp a semiconductor wafer in a fixed position for ion implantation and, in most cases, to provide cooling of the wafer. In addition, means must be provided for exchanging wafers after completion of ion implantation. In commercial semiconductor processing, a major objective is to achieve a high throughput in terms of wafers processed per unit time. One way to achieve high throughput is to use a high current ion beam so that the implantation process is completed in a shorter time. However, large amounts of heat are likely to be generated by the high current ion beam. The heat can result in uncontrolled diffusion of impurities beyond prescribed limits in the wafer and in degradation of patterned photoresist layers. Accordingly, it is usually necessary to provide wafer cooling in order to limit the maximum wafer temperature to about 100° C., and limiting the maximum wafer temperature to less than 100° C. may be required in the future.

A number of techniques for clamping a semiconductor wafer at the target mounting site are known in the art. One known technique involves the use of electrostatic forces. A dielectric layer is positioned between a semiconductor wafer and a conductive support plate. A voltage is applied between the semiconductor wafer and the support plate, and the wafer is clamped against the dielectric layer by electrostatic forces. An electrostatic wafer clamp is disclosed by G. A. Wardly in "Electrostatic Wafer Chuck for Electron Beam Microfabrication", *Rev. Sci. Instrum.*, Vol. 44, No. 10, October 1972, pp. 1506–1509 and in U.S. Pat. No. 3,993,509 issued Nov. 23, 1976 to McGinty. Electrostatic wafer clamp arrangements which utilize a thermally-conductive material to remove heat from the wafer are disclosed in U.S. Pat. No. 4,502,094, issued Feb. 26, 1985 to Lewin et al., U.S. Pat. No. 4,665,463, issued May 12, 1987 to Ward et al., and U.S. Pat. No. 4,184,188, issued Jan. 15, 1980 to Briglia. The Briglia patent discloses a support plate having layers of thermally-conductive, electrically-insulative RTV silicone. Electrostatic wafer clamps are also disclosed in U.S. Pat. No. 4,480,284, issued Oct. 30, 1984 to Tojo et al., U.S. Pat. No. 4,554,611, issued Nov. 19, 1985 to Lewin, U.S. Pat. No. 4,724,510, issued Feb. 9, 1988 to Wicker et al. and U.S. Pat. No. 4,412,133, issued Oct. 25, 1983 to Eckes et al.

An electrostatic wafer clamp that provides highly satisfactory performance is disclosed in U.S. Pat. No. 4,452,177, issued Sep. 19, 1995 to Frutiger. A six-phase electrostatic wafer clamp includes a platen having six sector-shaped electrodes. Voltages with six different phases are applied to the electrodes, with the voltages applied to electrodes on opposite sides of the platen being one-half cycle out of phase. The applied voltages are preferably bipolar square waves.

As indicated above, wafer cooling is typically required during ion implantation. The technique of gas conduction has been utilized for wafer cooling in vacuum. A coolant gas, introduced into a region between the semiconductor wafer and the clamping surface, provides thermal coupling between the wafer and a heat sink. Gas conduction in an electrostatic wafer clamp is disclosed in the aforementioned U.S. Pat. No. 5,452,177.

Wafer clamps which employ gas conduction cooling typically employ means for retaining the coolant gas in the region between the wafer and the clamping surface and thereby limiting leakage of the gas into the vacuum chamber. Such leakage reduces cooling effectiveness and contaminates the vacuum chamber.

Several prior art techniques have been utilized for retaining the coolant gas. One approach uses a perimeter seal, such as an O-ring or a lip seal, at the perimeter of the clamping surface, as disclosed for example in the aforementioned U.S. Pat. No. 5,452,177. The sealing surface comes into contact with the perimeter of the wafer, sealing against the wafer. However, the perimeter seal can easily become damaged, since it is exposed on the clamping surface. The perimeter seal may lose effectiveness easily, becoming contaminated over time with the particulates that are inevitable in process chambers. Particles may be generated by the seal rubbing against the wafer. The rough back side of the silicon wafer itself may compromise the seal. Even when the seal is not compromised, an elastomeric seal is permeable to hydrogen, helium and the lighter gases. Further, an elastomeric seal suffers from compression set and degradation due to harsh processing environments such as radiation and/or severe chemicals.

Another approach to retaining the coolant gas utilizes an area seal, where the wafer is electrostatically clamped against a polished platen surface, providing a minimal clearance between the platen and the wafer, and limiting gas leakage. An area seal produced by the electrostatic clamping of a wafer against a flat and finely polished clamping surface is more resistant to damage than the perimeter seal. However, the area seal may be somewhat more susceptible to leakage due to trapped particles which increase the space between the wafer and the clamping surface. This drawback may be alleviated somewhat by the flexibility of the wafer, and the edge of the wafer may seal around the perimeter despite particles trapped toward the center. However, the increased gas pressure required for adequate cooling requires increased clamping voltage to maintain the wafer clamped against the clamping surface. Typically, as the coolant gas pressure increases, the leak rate also increases.

Another technique for limiting coolant gas leakage into the vacuum chamber utilizes an annular groove around the periphery of the clamping surface. The groove is connected to a vacuum pump, and the coolant gas is removed before it leaks into the vacuum chamber. See, for example, U.S. Pat. No. 4,603,466, issued Aug. 5, 1986 to Morley. This approach has the disadvantages of reduced clamping force in the case of an electrostatic wafer clamp and reduced cooling in the region of the annular groove.

The above-identified problem of gas leakage from the periphery of an electrostatic wafer clamp is an example of a more general sealing problem which involves the leakage of gas between two closely spaced or contacting surfaces of arbitrary shape. Another example of the sealing problem occurs in a shaft seal wherein a shaft extends through a wall from a region of higher pressure to a region of lower pressure. The surfaces cannot be permanently sealed, such as with an adhesive, because of relative movement between the surfaces. In the case of the electrostatic wafer clamp, the wafer is removed after processing. In the case of the shaft seal, the shaft is movable relative to the seal in which it is mounted.

Accordingly, there is a need for improved techniques for limiting leakage of a gas between closely spaced or contacting surfaces.

SUMMARY OF THE INVENTION

According to a first aspect of the invention, apparatus is provided for holding a workpiece, such as a semiconductor wafer, during processing. The apparatus comprises a platen assembly, a gas source and a voltage source. The platen assembly includes a dielectric element that defines an electrically insulating clamping surface for receiving a workpiece and a plurality of sealing electrodes. The sealing electrodes may include at least three sealing electrodes at or near the periphery of the clamping surface. The gas source provides a gas in a region between the workpiece and the clamping surface, typically for conducting thermal energy between the workpiece and the clamping surface. The voltage source applies voltages to the sealing electrodes for transporting the gas.

The sealing electrodes may comprise concentric rings at or near the periphery of the clamping surface. The voltages applied to the sealing electrodes may produce an inwardly moving wave in the workpiece. Gas is transported inwardly away from the periphery of the clamping surface by the inwardly moving wave. The moving wave in the workpiece defines a moving pocket between the workpiece and the clamping surface. Gas in the moving pocket is transported inwardly with the moving pocket.

The voltage source preferably generates voltages that alternate between attraction and release of the workpiece. The voltages applied to different sealing electrodes are phased to produce the moving wave. The voltages may each include attractive voltage segments and non-attractive voltage segments in a repeating sequence and may be phased such that the attractive voltage segments and the non-attractive voltage segments move from electrode to electrode and define a direction of gas transport.

In one embodiment, the electrodes further comprise one or more clamping electrodes for electrostatically clamping the workpiece in a fixed position on the clamping surface in response to one or more clamping voltages. The clamping electrodes may be located inwardly of the sealing electrodes. In another embodiment, multiple sealing electrodes electrostatically clamp the workpiece in a fixed position on the clamping surface.

According to another aspect of the invention, a platen assembly is provided for clamping a semiconductor wafer during processing. The platen assembly comprises a dielectric element that defines a clamping surface for receiving a semiconductor wafer, a conduit for introducing a gas into a region between the semiconductor wafer and the clamping surface, one or more clamping electrodes for electrostatically clamping the semiconductor wafer to the clamping surface in response to one or more clamping voltages, and a plurality of sealing electrodes at or near a periphery of the clamping surface for producing an inwardly moving wave in the semiconductor wafer in response to applied electrode voltages. The gas is transported inwardly away from the periphery of the clamping surface by the inwardly moving wave.

According to a further aspect of the invention, a platen assembly is provided for clamping a semiconductor wafer during processing. The platen assembly comprises a dielectric element that defines a clamping surface for receiving a semiconductor wafer, a conduit for introducing a gas into a region between the semiconductor wafer and the clamping surface, and a plurality of electrodes for electrostatically clamping the semiconductor wafer to the clamping surface and for producing an inwardly moving wave in the semiconductor wafer in response to applied electrode voltages. The gas is transported inwardly away from the periphery of the clamping surface by the inwardly moving wave.

According to yet another aspect of the invention, a method is provided for clamping a workpiece during processing. The method includes the step of providing a platen assembly comprising a dielectric element that defines an electrically-insulating clamping surface and a plurality of sealing electrodes. The sealing electrodes may comprise at least three sealing electrodes at or near the periphery of the clamping surface. The method further includes the steps of mounting a workpiece on the clamping surface, introducing a gas into a region between the workpiece and the clamping surface, and applying voltages to the sealing electrodes for transporting the gas.

BRIEF DESCRIPTION OF THE DRAWINGS

For a better understanding of the present invention, reference is made to the accompanying drawings, which are incorporated herein by reference and in which:

FIGS. 14A–14D are schematic diagrams that illustrate operation of an electrostatic device having six electrodes;

DETAILED DESCRIPTION

Figure 1:
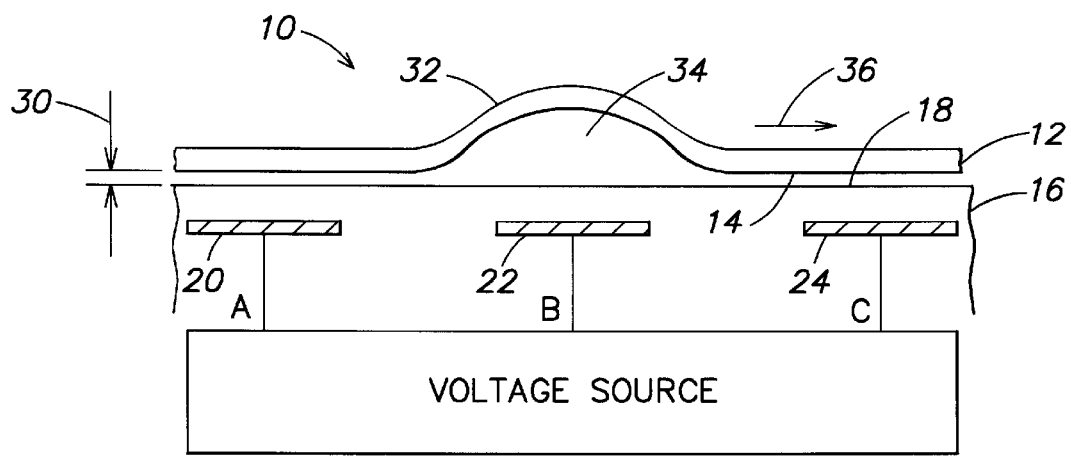
FIG. 1 is a schematic side view of a first embodiment of an electrostatic device in accordance with the invention.

A first embodiment of an electrostatic device in accordance with the invention is shown schematically in FIG. 1. As described below, the device may operate as an electrostatic seal or as an electrostatic vacuum pump. An electrostatic device 10 includes a conductive element 12 having a surface 14, a dielectric element 16 having a surface 18, and three or more sealing electrodes 20, 22 and 24. Electrodes 20, 22 and 24 are located adjacent to surface 18 of dielectric element 16 and are electrically isolated from surface 18. In the embodiment of FIG. 1, conductive element 12 is flexible, and dielectric element 16 is relatively rigid.

In one embodiment, electrodes 20, 22 and 24 are embedded in dielectric element 16 and are electrically isolated from surface 18. In another embodiment, dielectric element 18 has a layered structure, and electrodes 20, 22 and 24 are located between layers. Electrodes 20, 22 and 24 may be deposited on the surface of one of the layers. In each case, electrodes 20, 22 and 24 are physically connected to dielectric element 16 so that dielectric element 16 remains in a substantially fixed position with respect to electrodes 20, 22 and 24.

Figure 9:
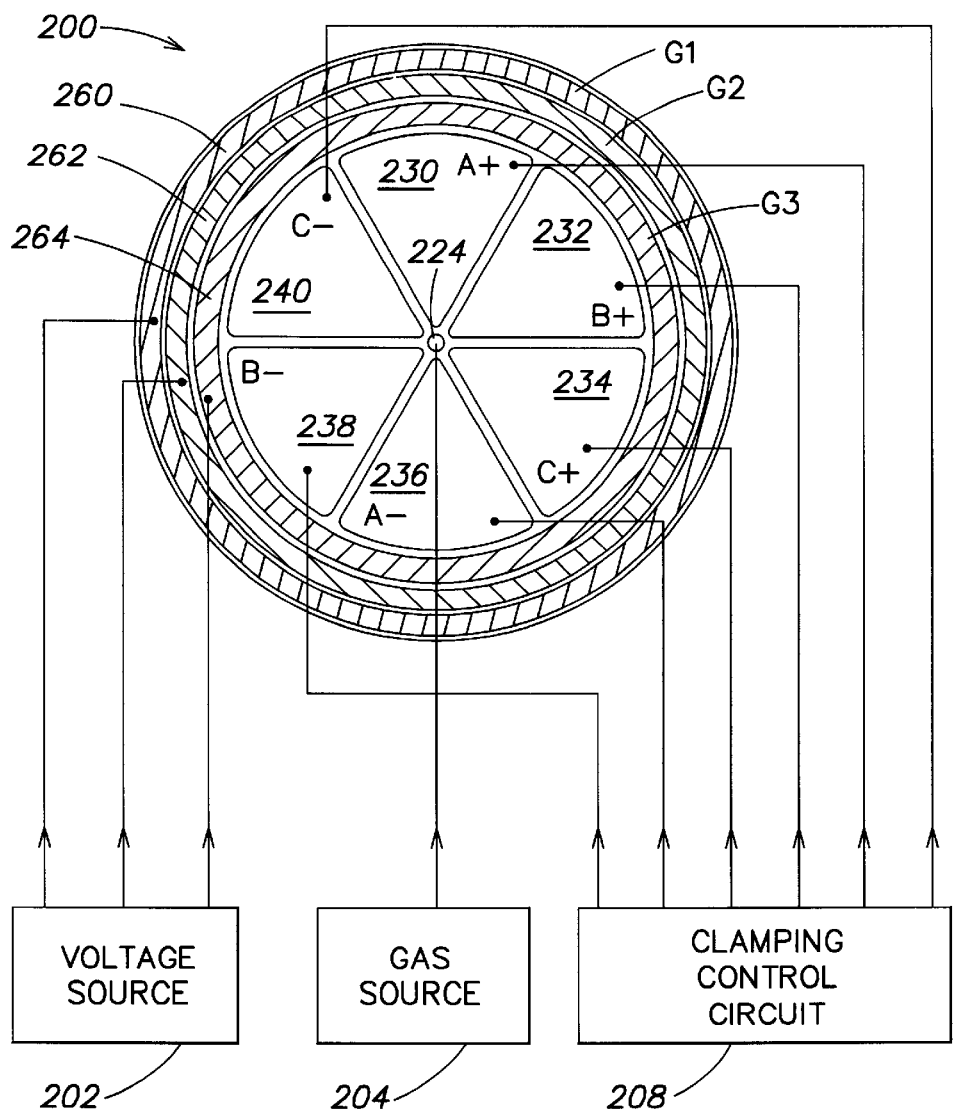
FIG. 9 is a top view of a first embodiment of an electrostatic wafer clamp incorporating an electrostatic seal in accordance with the invention.
Figure 16A:
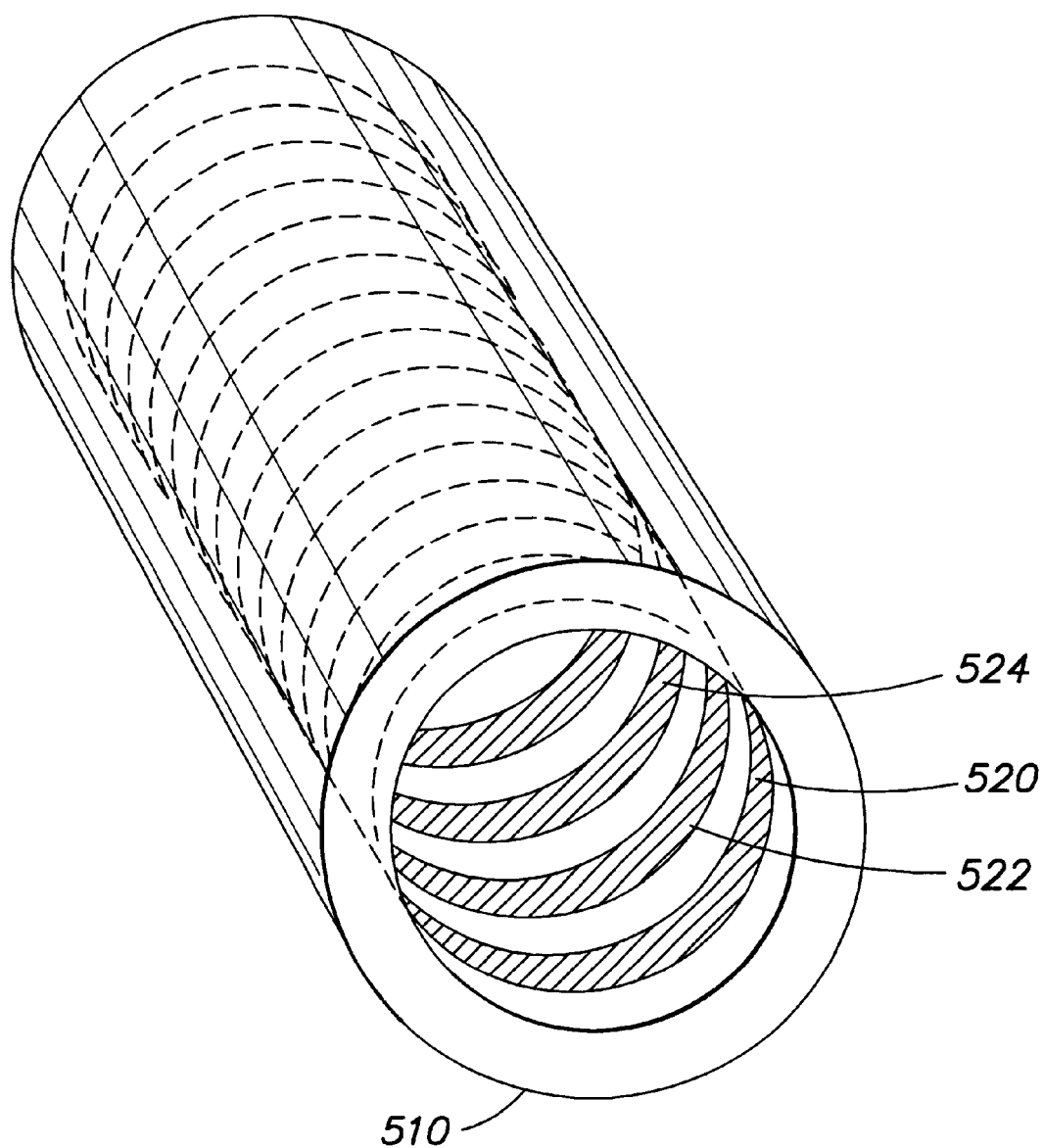
FIGS. 16A–16C illustrate an electrostatic shaft seal in accordance with the invention.
Figure 16B:
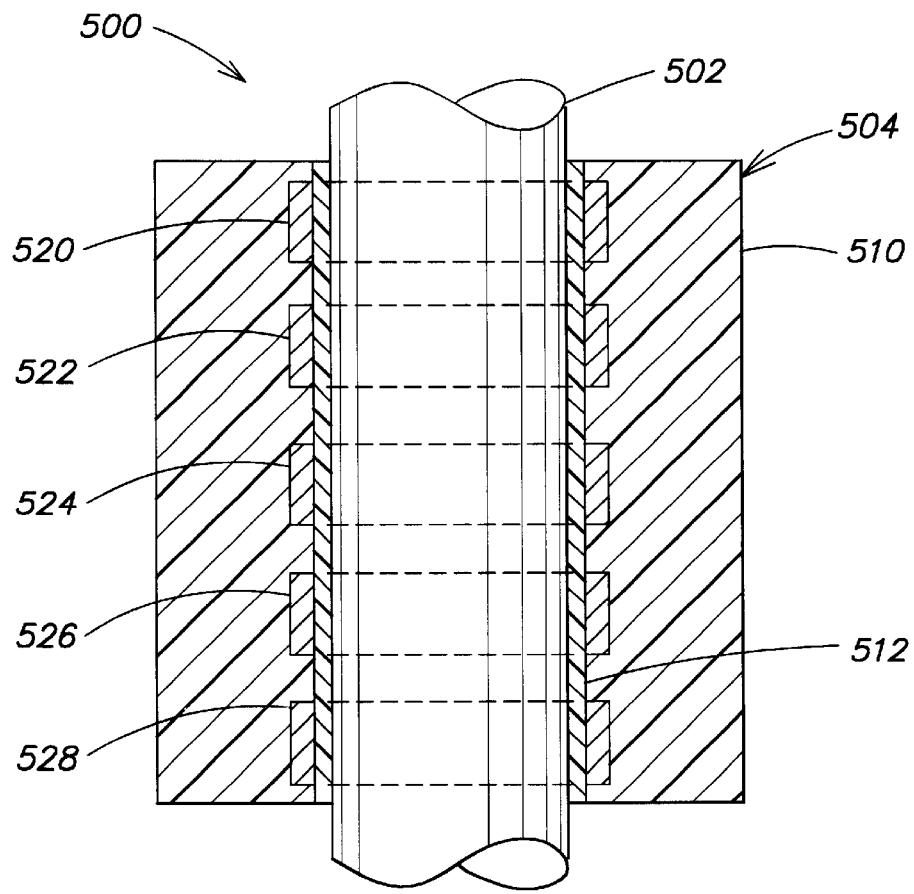

Electrodes 20, 22 and 24 may extend parallel to surface 18 and may have any desired shape. In one example, the electrodes are concentric rings and lie in a plane, as shown in FIG. 9. In another example, the electrodes are axially-spaced rings of equal diameter and have a cylindrical configuration, as shown in FIGS. 16A and 16B.

Surfaces 14 and 18, which may be planar or non-planar, may be spaced apart by a small gap 30 or may be in physical contact. A gas is located in the gap 30 between surfaces 14 and 18. Even when surfaces 14 and 18 are in physical contact, the surfaces have microscopic voids which contain gas. In some applications, the gas may be introduced between the surfaces for heating or cooling. In other applications, the gas may be present as a result of leakage. In the absence of the electrostatic device of the present invention, the gas may flow or leak through gap 30 and through the microscopic voids in the surfaces 14 and 18 from a region of higher pressure to a region of lower pressure.

By application of appropriate voltages to electrodes 20, 22 and 24, a moving wave 32 is produced in the flexible conductive element 12. The moving wave 32 is an area of conductive element 12 that is lifted or spaced from dielectric element 16 and is bordered by areas of conductive element 12 that are in contact or nearly in contact with dielectric element 16. The moving wave 32 results from the flexibility of conductive element 12 and from electrostatic forces applied to conductive element 12, as described below. The moving wave 32 defines a moving pocket 34 between surfaces 14 and 18 that transports gas and thereby produces a pressure differential. The moving wave 32 may be viewed as producing a compression wave in the gas between surfaces 14 and 18. The direction of gas transport is generally parallel to surfaces 14 and 18 with a direction 36 determined by the phasing of the sealing voltages applied to electrodes 20, 22 and 24.

Figure 2:
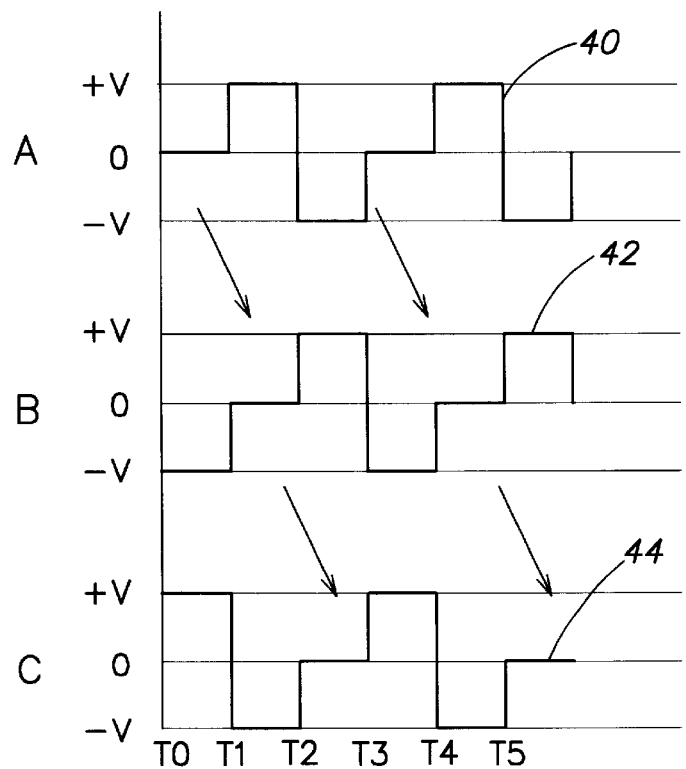
FIG. 2 illustrates a first example of voltage waveforms that may be applied to the electrodes in the electrostatic device of FIG. 1.

A first example of a set of voltage waveforms suitable for operation of the electrostatic device is shown in FIG. 2. A voltage 40 is applied to electrode 20; a voltage 42 is applied to electrode 22; and a voltage 44 is applied to electrode 24. As shown in FIG. 2, each voltage has a repeating sequence of a zero voltage segment, a +V voltage segment and a −V voltage segment. The +V and −V voltages are sufficient to produce electrostatic attraction between conductive element 12 and dielectric element 16. The voltages differ from those typically applied to electrostatic clamping devices by having zero voltage segments in which there is no electrostatic attraction. Thus, the voltages produce, on each electrode, periods of electrostatic attraction and periods of no electrostatic attraction. As further shown in FIG. 2, the voltages 40, 42 and 44 are phased such that the zero voltage segments move spatially from electrode 20 to electrode 22 to electrode 24 in a repeating sequence. In particular, zero voltage is applied to electrode 20 during time T0; zero voltage is applied to electrode 22 during time T1; and zero voltage is applied to electrode 24 during time T2. This sequence is repeated, as shown for example during times T3, T4 and T5. The frequency of the voltages is selected based on the thickness and flexibility of conductive element 12 and may be in a range of 20 Hz to 40 Hz for a silicon wafer, for example. In the example of FIG. 2, the sum of voltages 40, 42 and 44 is zero at every instant of time, thus avoiding charging of conductive element 12.

Figure 3A:
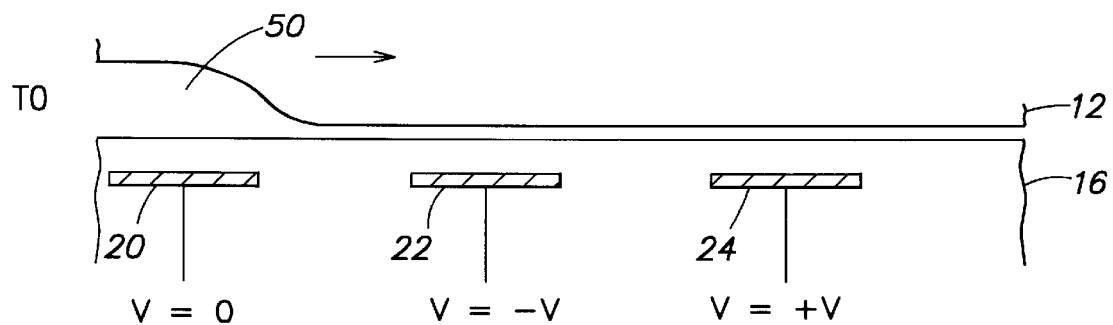
FIGS. 3A–3C illustrate the operation of the electrostatic device of FIG. 1.
Figure 3B:
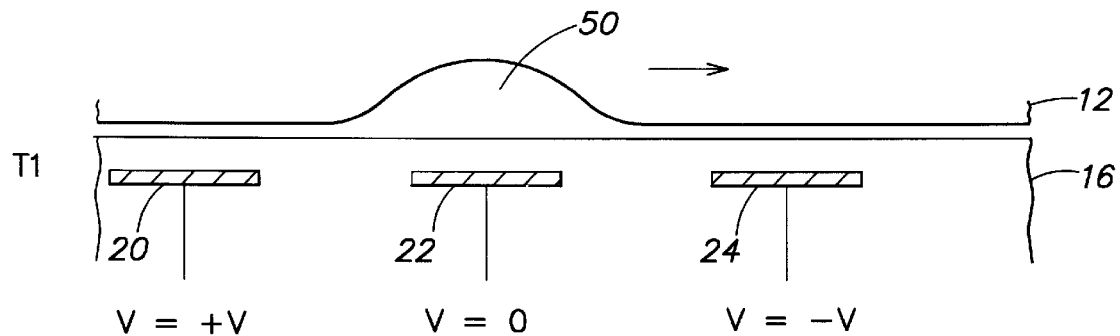
Figure 3C:
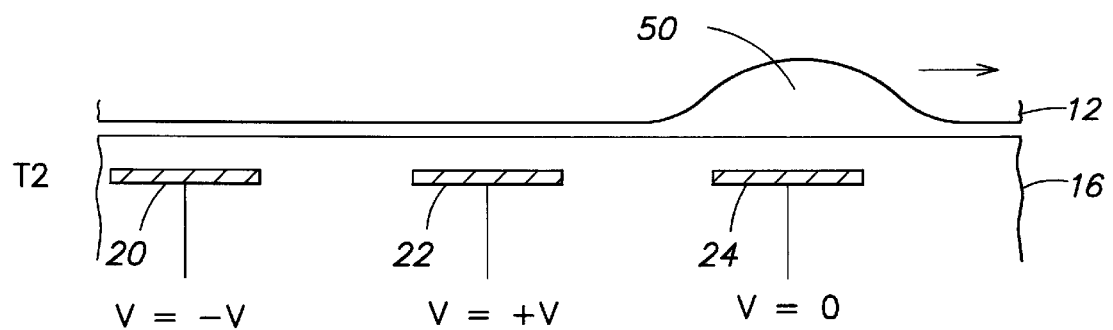

Referring now to FIGS. 3A–3C, the operation of the electrostatic device is illustrated. FIGS. 3A, 3B and 3C correspond to times T0, T1 and T2, respectively, in FIG. 2. During time T0, shown in FIG. 3A, a portion of conductive element 12 opposite electrode 20 is not attracted by electrode 20 (V=0); a portion of conductive element 12 opposite electrode 22 is attracted by electrode 22 (V=−V); and a portion of conductive element 12 opposite electrode 24 is attracted by electrode 24 (V=+V). Because of the flexible characteristic of conductive element 12, surfaces 14 and 18 are brought into contact adjacent to electrodes 22 and 24, and a space or a pocket 50 is formed between surfaces 14 and 18 adjacent to electrode 20. During time T1, shown in FIG. 3B, portions of conductive element 12 opposite electrodes 20 and 24 are attracted by electrodes 20 and 24, and a portion of conductive element 12 opposite electrode 22 is not attracted by electrode 22. As a result, pocket 50 moves from a position adjacent to electrode 20 (FIG. 3A) to a position adjacent to electrode 22 (FIG. 3B). During time T2, shown in FIG. 3C, portions of conductive element 12 opposite electrodes 20 and 22 are attracted by electrodes 20 and 22, and a portion of conductive element 12 opposite electrode 24 is not attracted by electrode 24. Thus, pocket 50 moves to a position adjacent to electrode 24.

The operation illustrated in FIGS. 3A–3C may be viewed as a wave in flexible conductive element 12 that moves from left to right during times T0 to T2. The process is repeated, and another wave moves from left to right during times T3–T5, and so on. The moving wave in conductive element 12 defines moving pocket 50 which transports gas in the region between conductive element 12 and dielectric element 16 in the direction of the moving pocket 50. As a result, a pressure gradient or differential is produced across the electrostatic seal from left to right.

The electrostatic device of the invention may function as an electrostatic seal or as an electrostatic vacuum pump. When the device functions as an electrostatic seal, the direction of gas transport by the moving wave is opposite the direction of gas leakage through the seal. Because the device transports gas from one location to another, it can be utilized as a vacuum pump for removing gas from a specified volume. Accordingly, where an electrostatic seal is described herein, it will be understood that the device can also function a an electrostatic vacuum pump.

The electrostatic seal of the present invention is an active seal that limits gas flow or gas leakage through a gap between two surfaces. The surfaces may have arbitrary surface contours. The electrostatic seal is useful where a pressure differential exists across the seal. The active electrostatic seal transports gas in a direction opposite the direction of undesired leakage. Examples of applications in electrostatic wafer clamps and shaft seals are described below.

It will be understood that the effectiveness of the electrostatic seal shown in FIGS. 1–3C depends on a variety of parameters, including the thickness, flexibility and conductivity of conductive element 12, the width and spacing of electrodes 20, 22 and 24, and the parameters of the voltages, including amplitudes, waveforms and frequencies. For example, the width and spacing of the electrodes are selected based on the thickness and flexibility of conductive element 12. In addition, the frequency of the voltages should be compatible with the mechanical time constant of conductive element 12. The thickness and flexibility of conductive element 12 should permit formation of a moving wave as described above.

Figure 4:
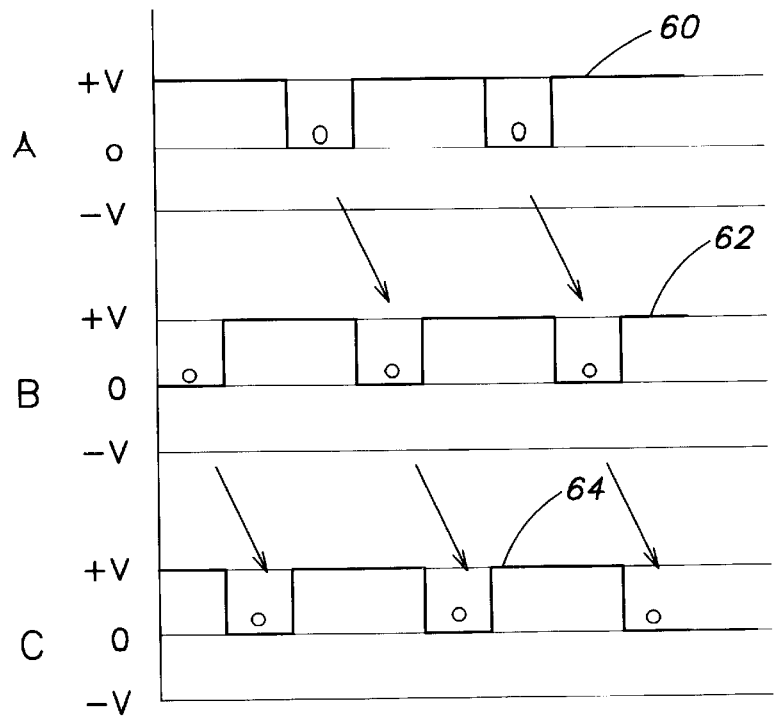
FIG. 4 illustrates a second example of voltage waveforms suitable for operation of the electrostatic device of FIG. 1.

A second example of a set of voltage waveforms suitable for operation of the electrostatic seal is shown in FIG. 4. Voltages 60, 62 and 64 are applied to electrodes 20, 22 and 24, respectively. Each voltage alternates between +V volts and zero volts. The voltages are phased such that the zero voltage segment, in which conductive element 12 is not attracted, moves from electrode 20 to electrode 22 to electrode 24. Voltages 60, 62 and 64 produce a moving wave in conductive element 12, as shown in FIGS. 3A–3C and described above. The sum of the voltages is not maintained at zero at every instant of time in the example of FIG. 4.

Figure 5:
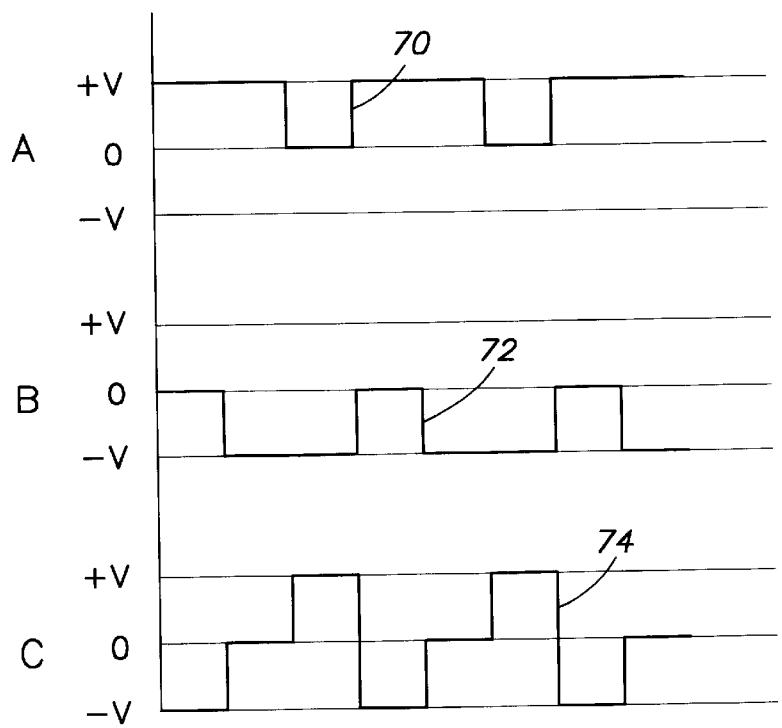
FIG. 5 illustrates a third example of voltage waveforms suitable for operation of the electrostatic device of FIG. 1.

A third example of a set of voltage waveforms suitable for operation of the electrostatic seal is shown in FIG. 5. Voltages 70, 72 and 74 are applied to electrodes 20, 22 and 24, respectively. Voltages 70, 72 and 74 produce a moving wave in conductive element 12 as described above in connection with FIGS. 3A–3C. In the example of FIG. 5, the sum of the voltages is maintained at zero at every instant of time, but the three waveforms are different.

Figure 6:
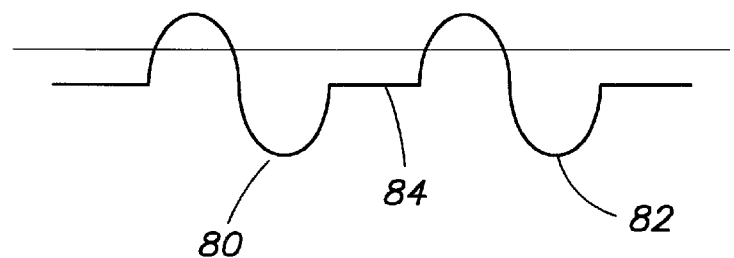
FIG. 6 illustrates a fourth example of a voltage waveform suitable for operation of the electrostatic device of FIG. 1.

The voltages are not limited to pulse trains as illustrated in FIGS. 2, 4 and 5. A modified sinusoidal voltage waveform 80 is shown in FIG. 6. The waveform includes a sine wave 82 followed by a zero voltage segment 84. The waveforms applied to electrodes 20, 22 and 24 may be phased as shown in FIG. 2 and described above.

The voltage waveforms shown in FIGS. 2 and 4–6 include zero voltage segments in which the conductive element 12 is not attracted to the dielectric element 16. It will be understood that the voltage waveforms may include zero voltage segments or low voltage segments in which the conductive element 12 is not substantially attracted by electrostatic forces. In addition, by reversing the connections of the voltages to electrodes 20, 22 and 24, the electrostatic seal can be made to transport gas from right to left in FIG. 1.

Figure 7:
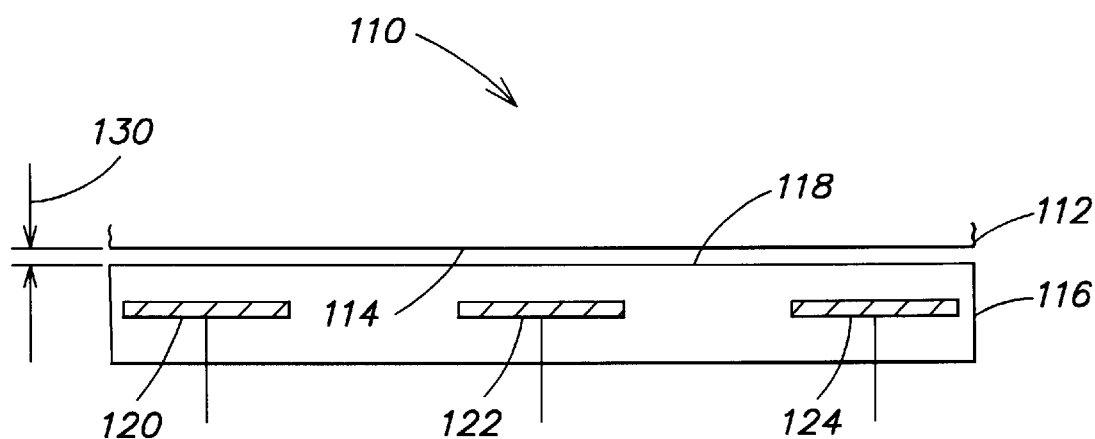
FIG. 7 is a schematic diagram of a second embodiment of the electrostatic device.

A second embodiment of an electrostatic seal is shown in FIG. 7. An electrostatic seal 110 includes a relatively rigid conductive element 112 having a surface 114, a flexible dielectric element 116 having a surface 118, and electrodes 120, 122 and 124 positioned adjacent to surface 118 and electrically isolated from surface 118. Surfaces 114 and 118 may be spaced apart by a small gap 130 or may be in physical contact. One of the sets of voltages shown by way of example in FIGS. 2 and 4–6 may be applied to electrodes 120, 122 and 124.

Figure 8A:
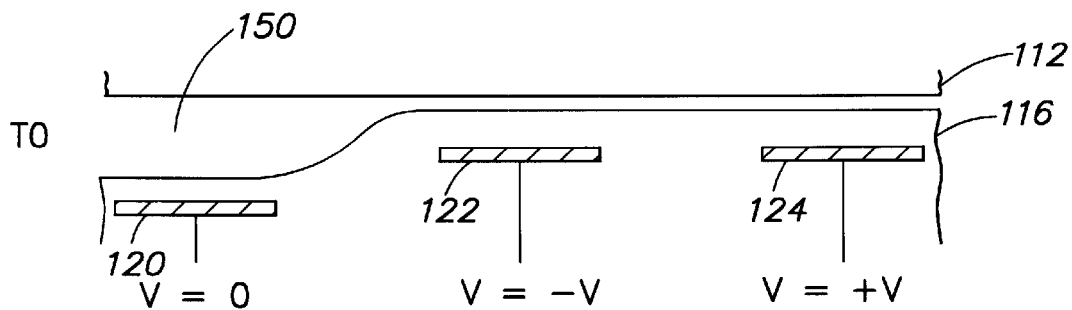
FIGS. 8A–8C illustrate the operation of the electrostatic device of FIG. 6.
Figure 8B:
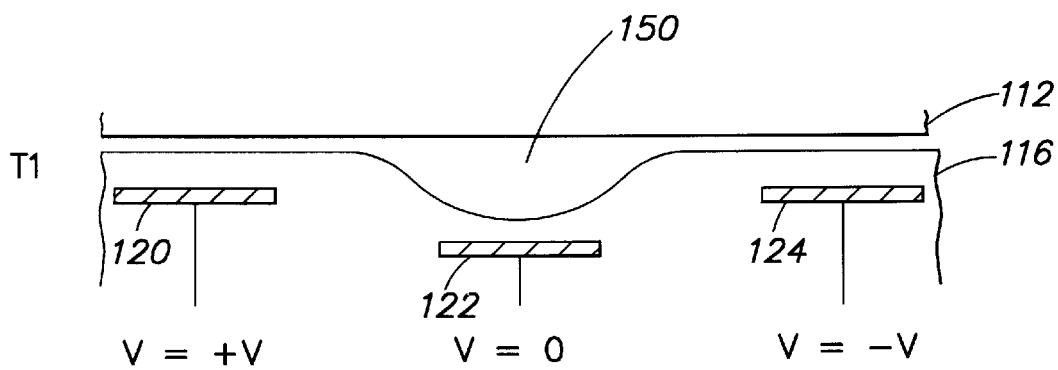
Figure 8C:
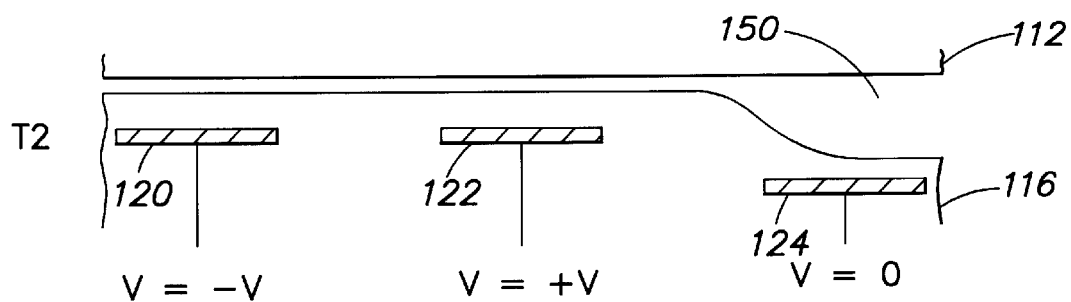

Electrostatic seal 110 operates in the same manner as electrostatic seal 10 shown in FIG. 1, except that a moving wave is formed in flexible dielectric element 116 rather than conductive element 112. The operation of electrostatic seal 110 is illustrated in FIGS. 8A–8C. The voltages applied to the electrodes 120, 122 and 124 are indicated by zero, +V and −V. As shown in FIG. 8A, zero voltage is applied to electrode 120 during time T0, and a pocket 150 is formed between dielectric element 116 and a portion of conductive element 112 adjacent to electrode 120. As shown in FIG. 8B, zero voltage is applied to electrode 122 during time T1, and pocket 150 is formed adjacent to electrode 122. As shown in FIG. 8C, zero voltage is applied to electrode 124 during time T2, and pocket 150 is formed adjacent to electrode 124. Thus, pocket 150 moves from left to right in the electrostatic seal at successive times T0, T1 and T2. Gas between surfaces 114 and 118 is transported by the moving pocket 150. Moving pocket 150 is defined by a wave in flexible dielectric element 116.

The flexible dielectric element shown in FIG. 7 may be an engineering plastic such as Delrin. The flexure is based on the gas pressure and may be in a range of about 0.0001 to 0.001 inch from the relaxed position to the attracted position. The maximum displacement should be less than the mean free path of the gas between the surfaces. The electrodes and the dielectric layer must be flexible enough to accommodate flexure without delamination or cracking. This can be achieved by vapor deposition of these layers to a small thickness. For example, a titanium nitride electrode layer may be followed by a silicon carbide dielectric layer. The dielectric layer should be of high strength and hardness and should be smooth, without blemish and have a low coefficient of friction.

Figure 10:
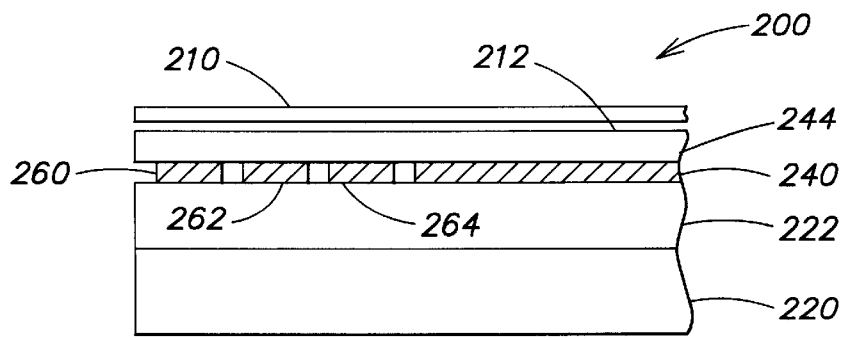
FIG. 10 is a partial cross-sectional view of the electrostatic wafer clamp of FIG. 9.

A first embodiment of an electrostatic wafer clamp incorporating an electrostatic seal is shown in FIGS. 9 and 10. The electrostatic wafer clamp includes a platen assembly 200, a voltage source 202, a gas source 204, and a clamping control circuit 208. Platen assembly 200 electrostatically clamps a workpiece, such as a semiconductor wafer 210, during processing in vacuum. Clamping control circuit 208 supplies clamping voltages to platen assembly 200 for electrostatic clamping of wafer 210 to a clamping surface 212. Gas source 204 supplies a gas between wafer 210 and clamping surface 212 during processing. The gas is usually a coolant gas for conducting thermal energy between wafer 210 and clamping surface 212 for cooling wafer 210. However, in some applications, the gas may be used for heating wafer 210. Voltage source 202 supplies voltages to platen assembly 200 for electrostatically sealing the coolant gas between wafer 210 and clamping surface 212. The electrostatic wafer clamp is typically utilized in an ion implantation system, but may be utilized in other wafer processing systems.

Platen assembly 200 includes a platen base 220 and an insulating substrate 222 mounted on an upper surface of platen base 220. The platen base 220 and the insulating substrate 222 are generally circular and may have a central opening 224 for a wafer lift mechanism (not shown) and for introduction of coolant gas from gas source 204. Six sector-shaped clamping electrodes 230, 232, 234, 236, 238 and 240 are located between an upper surface of substrate 222 and a dielectric insulator 244. Dielectric insulator 244 may have the form of six sections which correspond to the six electrodes. Clamping electrodes 230, 232, All 234, 236, 238 and 240 are coupled to clamping control circuit 208, which supplies clamping voltages when clamping of wafer 210 is desired. The clamping voltages are preferably bipolar square waves having six different phases (0°, 60°, 120°, 180°, 240° and 300°). The phases of the voltages applied to electrodes on opposite sides of the platen assembly are one half cycle, or 180°, out of phase. The construction and operation of a six-phase electrostatic wafer clamping apparatus is described in detail in the aforementioned U.S. Pat. No. 5,452,177, which is hereby incorporated by reference.

Platen assembly 200 further includes sealing electrodes 260, 262 and 264. Sealing electrodes 260, 262 and 264 may have the form of concentric rings that are located at or near the periphery of clamping surface 212 and are electrically isolated from clamping surface 212. In the example of FIG. 9, sealing electrodes 260, 262 and 264 surround clamping electrodes 230, 232, 234, 236, 238 and 240. Sealing electrodes 260, 262 and 264 may be located between insulating substrate 222 and dielectric insulator 244, as shown in FIG. 10. The width of each sealing electrode is selected based on the stiffness of semiconductor wafer 210 and its ability to flex during operation of the electrostatic seal. In one example, sealing electrodes 260, 262 and 264 may be configured as concentric rings each having a width in a range of about one-eighth inch to one-quarter inch and having spacings between electrodes of about 0.060 to 0.10 inch for operation at 1000 volts. Larger spacings between electrodes are required for operation at higher voltages, and smaller spacings may be used at lower voltages.

Voltage source 202 provides sealing voltages to electrodes 260, 262 and 264. One of the sets of voltage waveforms shown by way of example in FIGS. 2 and 4–6 may be utilized. Preferably voltage waveforms as shown in FIG. 2 or FIG. 5 are utilized, because the sum of the voltages is zero at all times, and wafer charging is minimized. These voltage waveforms sum to zero at each instant of time and minimize charging of the wafer 210. Suitable voltage waveforms may have amplitudes in the range of 900 to 1100 volts and frequencies in the range of 20 to 40 Hz for operation with silicon semiconductor wafers.

In operation, semiconductor wafer 210 is electrostatically clamped to clamping surface 212 by operation of clamping electrodes 230, 232, 234, 236, 238 and 240. A coolant gas from gas source 204 is introduced through central opening 224 to the region between wafer 210 and clamping surface 212. The coolant gas pressure is typically in a range of 1 torr to 100 torr for ion implantation. The coolant gas conducts thermal energy between wafer 210 and dielectric insulator 244. The electrostatic seal formed by sealing electrodes 260, 262 and 264 and voltage source 202 restricts leakage of coolant gas at the periphery of wafer 210 as described below.

Figure 11A:
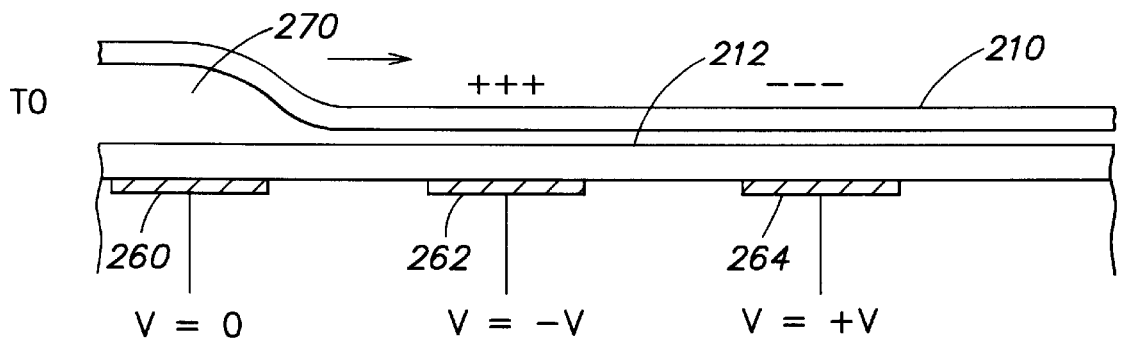
FIGS. 11A–11C illustrate the operation of the electrostatic seal in the wafer clamp of FIG. 9.
Figure 11B:
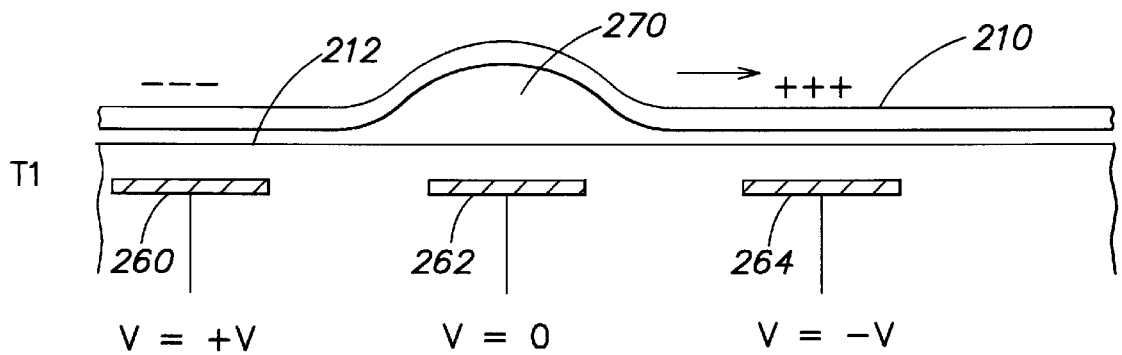
Figure 11C:
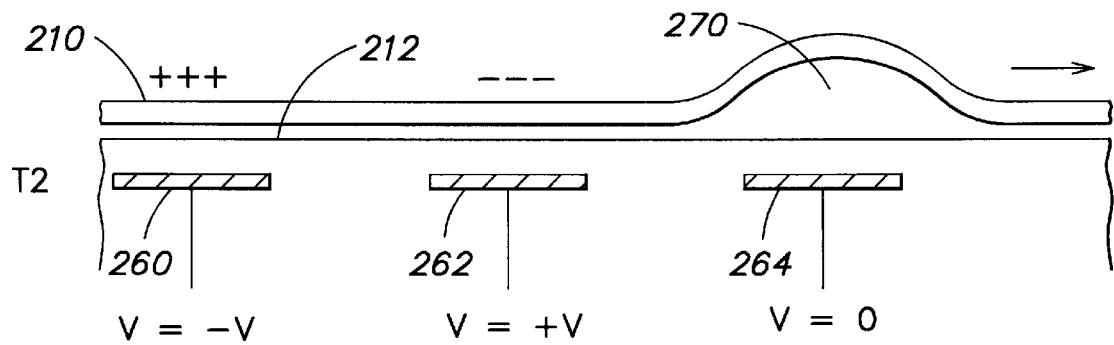

Operation of the peripheral electrostatic seal in the platen assembly 200 of FIG. 9 is shown in FIGS. 11A–11C. In the example of FIGS. 11A–11C, the voltage waveforms 40, 42 and 44 shown in FIG. 2 are applied to sealing electrodes 260, 262 and 264, respectively. As shown in FIG. 11A, which corresponds to time T0 in FIG. 2, zero voltage is applied to electrode 260, a voltage −V is applied to electrode 262 and a voltage +V is applied to electrode 264. Thus, portions of wafer 210 adjacent to electrodes 262 and 264 are attracted to clamping surface 212, and a pocket 270 is formed between wafer 210 and clamping surface 212 adjacent to electrode 260. As shown in FIG. 11B, which corresponds to time T1 in FIG. 2, voltage +V is applied to electrode 260, zero voltage is applied to electrode 262 and voltage −V is applied to electrode 264. Thus, portions of wafer 210 adjacent to electrodes 260 and 264 are attracted to clamping surface 212, and pocket 270 is formed adjacent to electrode 262. As shown in FIG. 11C, which corresponds to time T2 in FIG. 2, voltage −V is applied to electrode 260, voltage +V is applied to electrode 262 and zero voltage is applied to electrode 264. Portions of wafer 210 adjacent to electrodes 260 and 262 are attracted to clamping surface 212, and pocket 270 is formed adjacent to electrode 264. Since electrodes 260, 262 and 264 have the form of concentric rings (FIG. 9), the net effect is a circular, radially inwardly moving wave in wafer 210. The inwardly moving wave defines pocket 270 which transports coolant gas radially inwardly, thereby limiting leakage of coolant gas from the periphery of the platen assembly.

The electrostatic seal of platen assembly 200 is an active seal, using clamping surface 212 as a sealing surface and directing the coolant gas flow toward the center of wafer 210. The inwardly moving compression wave helps to reduce the leak rate at the edge of the wafer, since the momentum imparted to the gas molecules is in a direction opposite that required for leakage. It is believed that the same momentum will be imparted to any particles which may be present behind wafer 210, allowing a cleaner seal at the edges. As a result, higher gas pressures can be achieved behind the wafer for a given leak rate than was possible in prior art electrostatic wafer clamps. It will be understood that the electrostatic seal can be used in combination with one or more of the prior art sealing techniques.

It will be understood that sealing electrodes 260, 262 and 264 contribute to clamping of wafer 210 to clamping surface 212, since voltages are applied to two of the three electrodes at all times. The voltages applied to the sealing electrodes produce electrostatic clamping of wafer 210. In addition, it will be understood that three or more sealing electrodes may be utilized to provide enhanced sealing and further reduction in coolant gas leakage.

Figure 12:
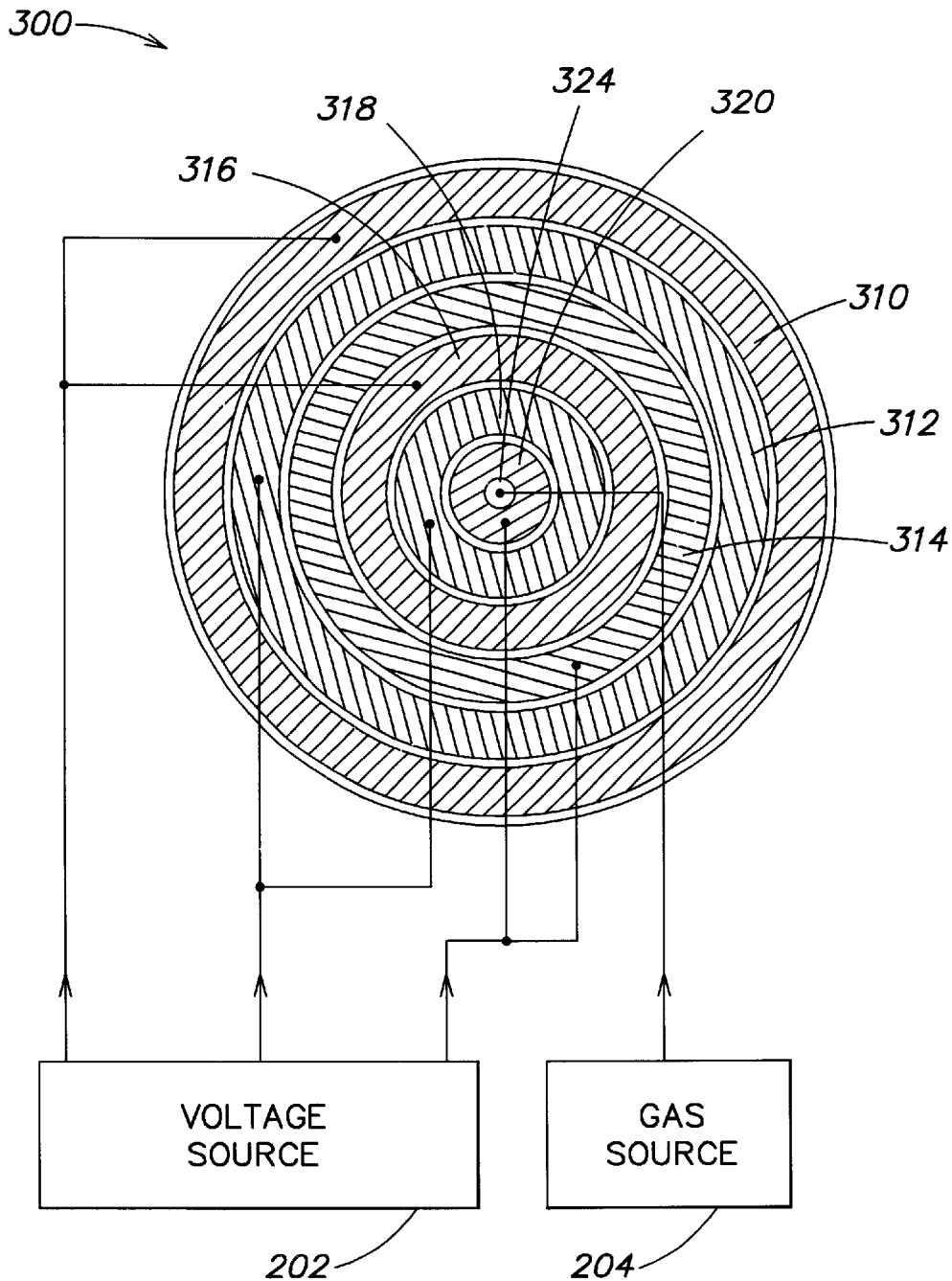
FIG. 12 is a top view of a second embodiment of an electrostatic wafer clamp incorporating an electrostatic seal in accordance with the invention.
Figure 13A:
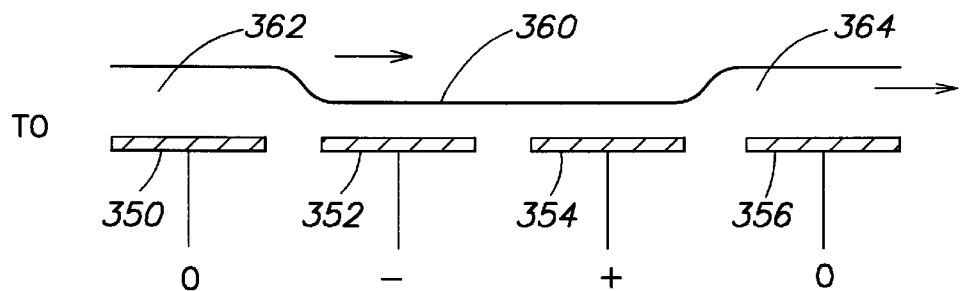
FIGS. 13A–13D are schematic diagrams that illustrate operation of an electrostatic device having four electrodes.
Figure 13B:
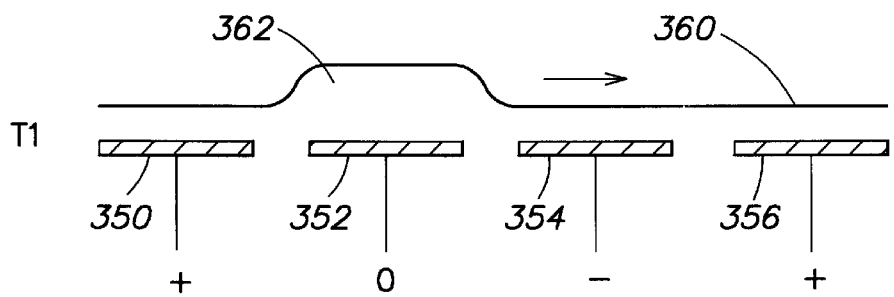
Figure 13C:
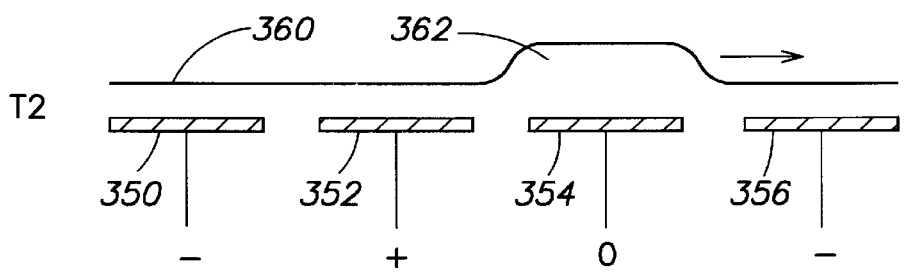
Figure 13D:
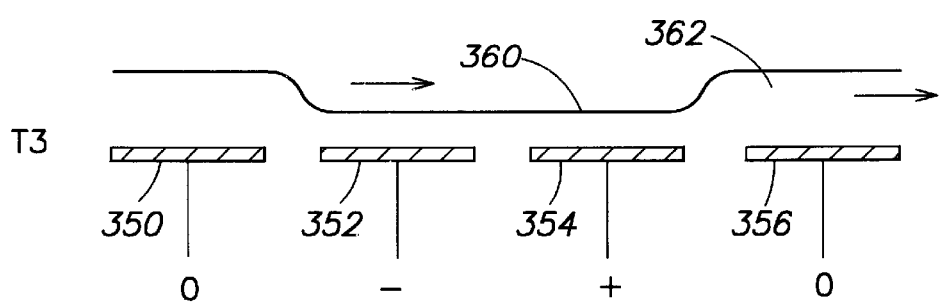
Figure 14A:
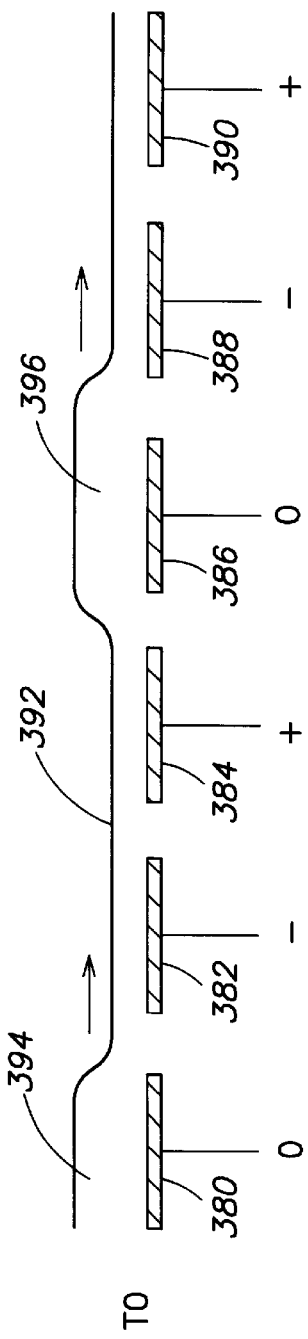
Figure 14B:
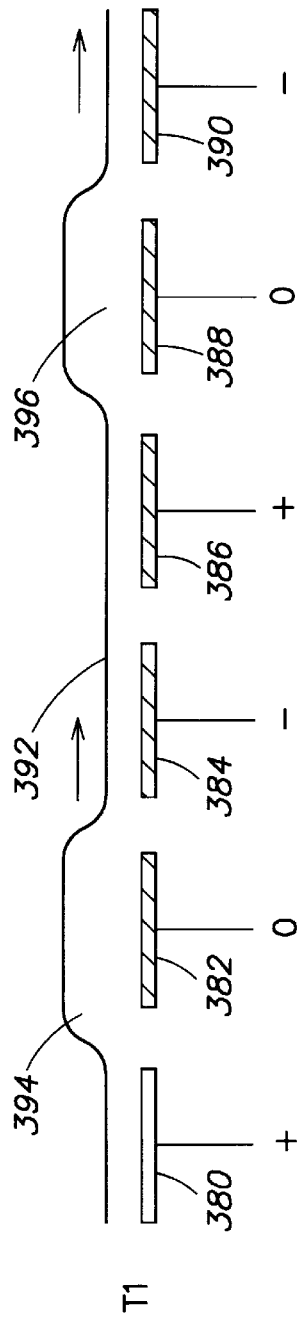

A second embodiment of an electrostatic wafer clamp incorporating an electrostatic seal is shown in FIG. 12. The electrostatic wafer clamp includes a platen assembly 300, sealing voltage source 202 and gas source 204. The platen assembly 300 includes multiple sealing electrodes. Platen assembly 300 may have the same general structure as platen assembly 200 shown in FIGS. 9 and 10 and described above, with the exception that the clamping electrodes are replaced with additional sealing electrodes. In particular, platen assembly 300 is provided with sealing electrodes 310, 312, 314, 316, 318 and 320. Electrodes 310, 312, 314, 316 and 318 have the form of concentric rings, and electrode 320 is a circular center electrode. Electrode 320 may be provided with an opening 324 for introduction of a coolant gas. It will be understood that the configuration of FIG. 12 is given by way of example only and that a practical platen assembly may include a larger number of sealing electrodes. In the embodiment of FIG. 12, the entire clamping surface is provided with sealing electrodes. The sealing electrodes perform the dual functions of wafer clamping and electrostatic sealing. Since the sealing electrodes perform the clamping function, a clamping control circuit, as shown in FIG. 9, is not required.

One of the sets of voltages shown by way of example in FIGS. 2 and 4–6 may be utilized with the platen assembly 300. As noted previously, the voltages of FIGS. 2 and 5 are preferred, because the sum of the voltages is zero at all times, and wafer charging is minimized. Referring again to FIGS. 2 and 12, voltage 40 may be coupled to sealing electrodes 310 and 316; voltage 42 may be coupled to electrodes 312 and 318; and voltage 44 may be coupled to electrodes 314 and 320.

The operation of platen assembly 300 corresponds to the operation shown in FIGS. 11A–11C and described above. The operation illustrated in FIGS. 11A–11C is repeated for each set of three sealing electrodes. As a result, a moving wave in the semiconductor wafer transports gas in a radial direction from the outer periphery toward the wafer center. Because the platen assembly 300 has multiple sealing electrodes, two or more moving waves are produced simultaneously in the semiconductor wafer. This enhances the performance of the electrostatic seal, because each moving wave transports gas toward the center of the platen assembly.

As indicated above, the electrostatic seal may utilize three or more sealing electrodes with appropriate voltages applied thereto. A larger number of sealing electrodes provides enhanced sealing performance as noted above. To ensure that the sum of voltages is zero at all times, multiples of three sealing electrodes should be utilized. Each voltage is coupled to every third sealing electrode. With reference for example to FIG. 2, voltage 40 is coupled to electrodes 1, 4, 7 etc., voltage 42 is coupled to electrodes 2, 5, 8, etc., and voltage 44 is coupled to electrodes 3, 6, 9, etc. Where charging of the workpiece is not an issue, any number of electrodes equal to or greater than three may be utilized. Conversely, where charging of the workpiece is an issue, multiples of three sealing electrodes and appropriate voltage waveforms may be used to avoid charging.

Operation of an electrostatic seal having four electrodes are shown schematically in FIGS. 13A–13D. For ease of illustration, only sealing electrodes 350, 352, 354 and 356, and flexible conductive element 360 are shown. Referring again to FIG. 2, voltage 40 is coupled to electrodes 350 and 356; voltage 42 is coupled to electrode 352, and voltage 44 is coupled to electrode 354. FIGS. 13A–13D correspond to times T0–T3, respectively, in FIG. 2. It may be observed that two moving pockets 362 and 364 are present simultaneously at certain times during operation of the four-electrode electrostatic seal.

Operation of a six-electrode electrostatic seal is shown schematically in FIGS. 14A–14D. For ease of illustration, only sealing electrodes 380, 382, 384, 386, 388 and 390, and flexible conductive element 392 are shown. Referring again to FIG. 2, voltage 40 is coupled to sealing electrodes 380 and 386; voltage 42 is coupled to electrodes 382 and 388; and voltage 44 is coupled to electrodes 384 and 390. As illustrated, this configuration produces two moving pockets 394 and 396 simultaneously in conductive element 392, thereby enhancing the effectiveness of the seal. The six electrode configuration corresponds to platen assembly 300 shown in FIG. 12 and described above.

Figure 15:
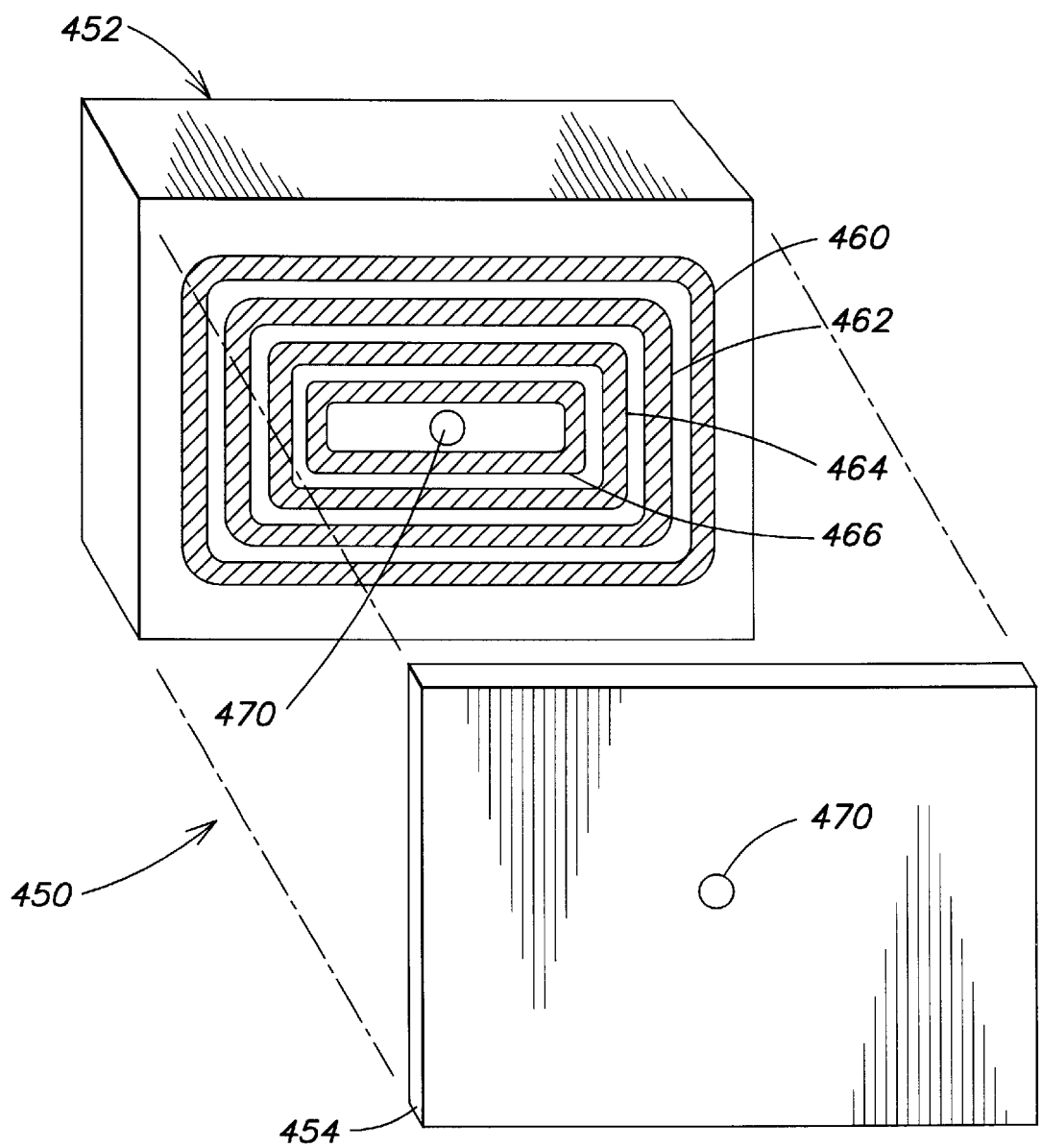
FIG. 15 is an exploded perspective view of a rectangular electrostatic face seal in accordance with the invention.

An example of an electrostatic face seal in accordance with the invention is shown in FIG. 15. A dielectric element 450 includes a substrate 452 and a dielectric insulator 454, shown in an exploded view in FIG. 15. In an operating electrostatic seal, dielectric insulator 454 is affixed to substrate 452. Rectangular sealing electrodes 460, 462, 464 and 466 are located between substrate 452 and dielectric insulator 454. Sealing electrodes 460, 462, 464 and 466 have a concentric configuration and surround a port 470. Port 470 may be used for introducing a gas or for exhausting a gas, depending upon the direction of gas transport. One of the sets of voltages shown by way of example in FIGS. 2 and 4–6 may be applied to electrodes 460, 462, 464 and 466. The dielectric element 450 operates with a conductive element (not shown in FIG. 15) to achieve gas transport in moving pockets as described above. The direction of gas transport may be toward or away from port 470, depending upon the phasing of voltages applied to electrodes 460, 462, 464 and 466.

The sealing electrodes 460, 462, 464 and 466 preferably have the form of closed loops and should be shaped to avoid sharp corners. Face seals of the type shown in FIG. 15 may utilize a variety of different electrode shapes such as square, circular, elliptical, rhombic, triangular, pentagonal, hexagonal, or arbitrarily shaped. In each case, the electrodes preferably are configured as a series of closed loops, with closed loop electrodes of larger dimensions surrounding those of smaller dimensions. As described above, the conductive element or the dielectric element may be flexible.

The electrostatic seals described above have a planar or nearly planar configuration. However, the electrostatic seal of the present invention is not limited to planar configurations. More generally, the electrostatic seal includes a conductive element and a dielectric element, one of which is flexible, having surfaces which are closely spaced or in contact. The surfaces may have any desired contours. The seal further includes three or more electrodes mounted in proximity to the dielectric surface, and typically mounted in the dielectric element.

Figure 16C:
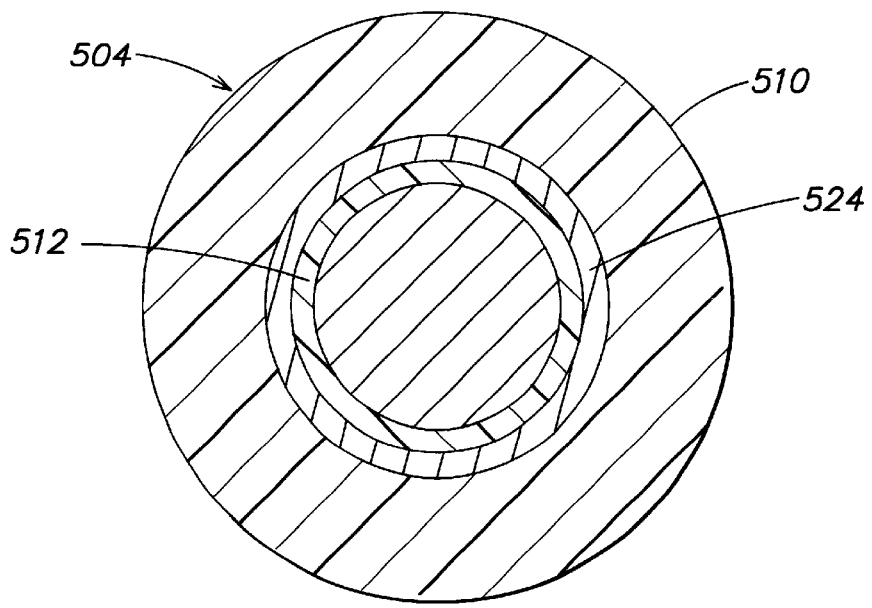

An example of a non planar electrostatic seal in accordance with the invention is shown in FIGS. 16A–16C. A shaft seal 500 includes a conductive shaft 502, and a cylindrical dielectric element 504 mounted on shaft 502. Dielectric element 504 is flexible and includes a cylindrical substrate 510 and a cylindrical dielectric insulator 512 located inside substrate 510. The dielectric insulator 512 is omitted from FIG. 16A for clarity. Sealing electrodes 520, 522, 524, 526 and 528 are located between substrate 510 and dielectric insulator 512. Sealing electrodes 520, 522, 524, 526 and 528 are in the form of axially spaced rings of equal diameters. One of the sets of voltages shown by way of example in FIGS. 2 and 4–6 may be applied to the sealing electrodes.

The shaft seal may extend through a wall or other barrier from a region of higher pressure to a region of lower pressure. Shaft 502 may rotate and/or reciprocate relative to dielectric element 504. The active electrostatic seal of the present invention limits gas leakage along the shaft and is characterized by low seal wear.

Figure 17:
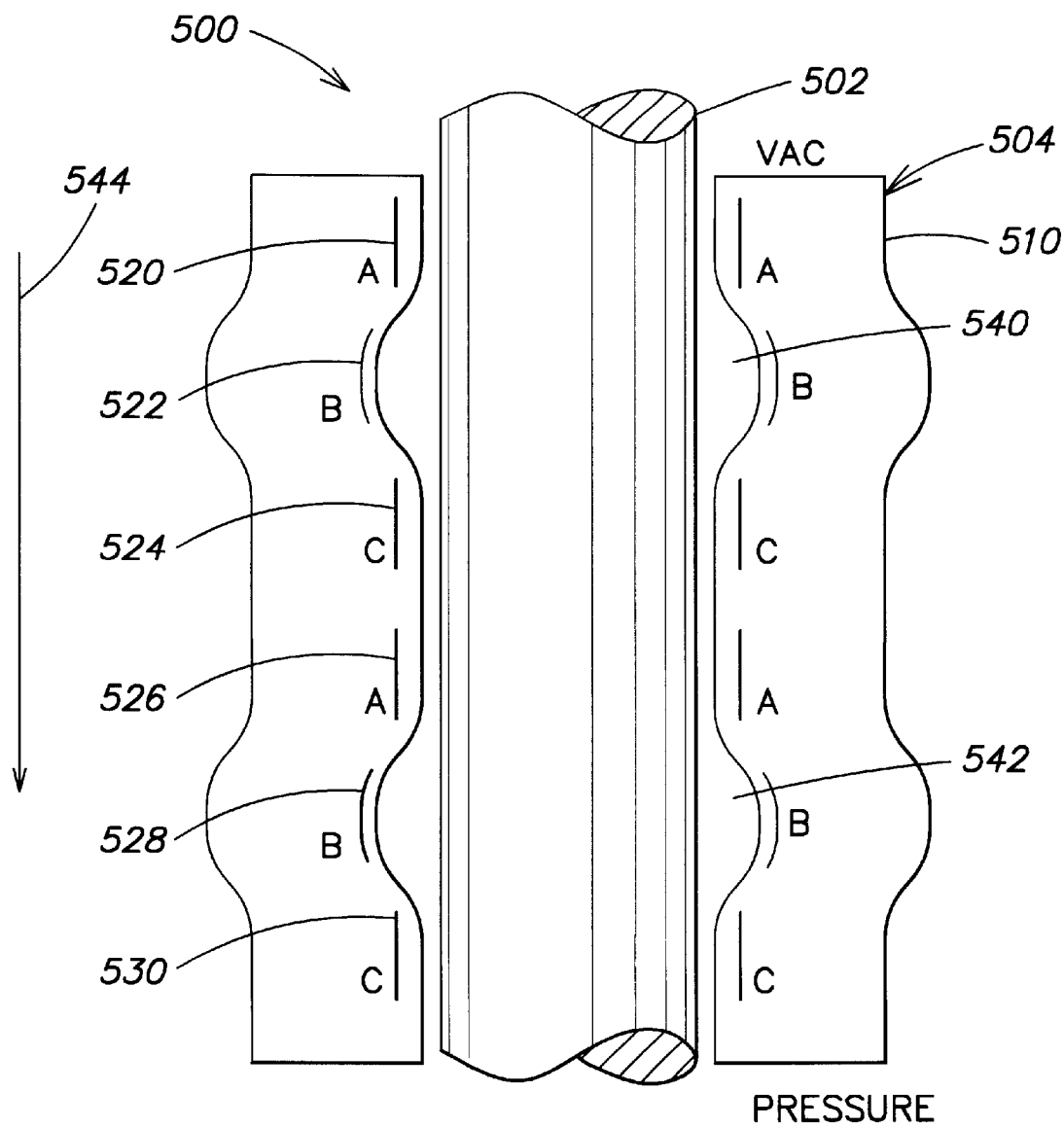
FIG. 17 illustrates the operation of the electrostatic shaft seal of FIG. 16A–16C.

Operation of the shaft seal 500 is illustrated in FIG. 17. The voltages applied to electrodes 520, 522, 524, 526, 528 and 530 cause axially moving waves in cylindrical element 504. The moving waves define pockets 540 and 542, which move in the direction of arrow 544. Moving pockets 540 and 542 transport gas axially with respect to shaft 502, thus limiting gas leakage in a direction opposite the direction of gas transport.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for holding a workpiece during processing, comprising:
   a platen assembly comprising a dielectric element that defines an electrically insulating clamping surface for receiving a workpiece and a plurality of sealing electrodes;
   a gas source for providing a gas in a region between the workpiece and said clamping surface; and
   a voltage source for applying time-varying voltages to said sealing electrodes to produce in the workpiece or said clamping surface a moving wave for transporting the gas.

2. Apparatus as defined in claim 1 wherein said sealing electrodes comprise at least three sealing electrodes underlying said clamping surface at or near a periphery of said clamping surface.

3. Apparatus as defined in claim 2 wherein said voltages produce an inwardly moving wave in the workpiece, wherein the gas is transported inwardly away from the periphery of said clamping surface by said inwardly moving wave.

4. Apparatus as defined in claim 1 wherein said sealing electrodes comprise concentric rings.

5. Apparatus as defined in claim 1 wherein said platen assembly further comprises one or more clamping electrodes for electrostatically clamping the workpiece in a fixed position on said clamping surface in response to one or more clamping voltages.

6. Apparatus as defined in claim 5 wherein said one or more clamping electrodes are located inwardly of said sealing electrodes.

7. Apparatus as defined in claim 1 wherein said sealing electrodes electrostatically clamp the workpiece in a fixed position said clamping surface.

8. Apparatus as defined in claim 1 wherein said sealing electrodes comprise a multiplicity of concentric rings.

9. Apparatus as defined in claim 3 wherein the moving wave in the workpiece defines a moving pocket between the workpiece and said clamping surface.

10. Apparatus as defined in claim 3 wherein said voltage source generates voltages that alternate between attraction and release of the workpiece and that are phased to produce said moving wave.

11. Apparatus as defined in claim 1 wherein said platen assembly is configured for clamping a semiconductor wafer.

12. Apparatus as defined in claim 1 wherein said voltage source generates voltages that each include attractive voltage segments and non-attractive voltage segments in a repeating sequence and wherein said voltages are phased such that said attractive voltage segments and said non-attractive voltage segments move from electrode to electrode and define a direction of gas transport.

13. Apparatus as defined in claim 1 wherein said sealing electrodes are located between layers of said dielectric element.

14. A platen assembly for clamping a semiconductor wafer during processing, comprising:
   a dielectric element that defines a clamping surface for receiving a semiconductor wafer;
   a conduit for introducing a gas into a region between the semiconductor wafer and said clamping surface;
   one or more clamping electrodes for electrostatically clamping the semiconductor wafer to said clamping surface in response to one or more clamping voltages; and
   a plurality of sealing electrodes at or near a periphery of said clamping surface for producing an inwardly moving wave in the semiconductor wafer in response to voltages, wherein the gas is transported inwardly away from the periphery of said clamping surface by said inwardly moving wave.

15. A platen assembly as defined in claim 14 wherein said sealing electrodes comprise concentric rings.

16. A platen assembly as defined in claim 14 wherein said one or more clamping electrodes are located inwardly of said sealing electrodes.

17. A platen assembly as defined in claim 14 wherein the moving wave in the semiconductor wafer defines a moving pocket between the semiconductor wafer and said clamping surface.

18. A platen assembly as defined in claim 14 wherein each of said voltages comprises attractive voltage segments and non-attractive voltage segments in a repeating sequence and wherein said voltages are phased such that said attractive voltage segments and said non-attractive voltage segments move from sealing electrode to sealing electrode and define a direction of gas transport.

19. A platen assembly as defined in claim 14 wherein each of said voltages comprises zero voltage segments and non-zero voltage segments in a repeating sequence and wherein said voltages are phased such that said zero voltage segments and said non-zero voltage segments move from sealing electrode to sealing electrode and define a direction of gas transport.

20. A platen assembly as defined in claim 14 wherein said sealing electrodes are located between layers of said dielectric element.

21. A platen assembly for clamping a semiconductor wafer during processing, comprising:
   a dielectric element that defines a clamping surface for receiving a semiconductor wafer;
   a conduit for introducing a gas into a region between the semiconductor wafer and said clamping surface; and
   a plurality of electrodes for electrostatically clamping the semiconductor wafer to said clamping surface and for producing an inwardly moving wave in the semiconductor wafer in response to applied electrode voltages, wherein the gas is transported inwardly away from the periphery of said clamping surface by said inwardly moving wave.

22. A platen assembly as defined in claim 21 wherein said electrodes comprise a multiplicity of concentric rings.

23. A platen assembly as defined in claim 21 wherein each of said electrode voltages comprises attractive voltage segments and non-attractive voltage segments in a repeating sequence and wherein said electrode voltages are phased such that said attractive voltage segments and said non-attractive voltage segments move from electrode to electrode and define a direction of gas transport.

24. A platen assembly as defined in claim 23 wherein the non-attractive voltage segments of said electrode voltages are zero voltage segments.

25. A platen assembly as defined in claim 21 wherein each of said electrode voltages comprises zero voltage segments and non-zero voltage segments in a repeating sequence and wherein said electrode voltages are phased such that said zero voltage segments and said non-zero voltage segments move from electrode to electrode and define a direction of gas transport.

26. A platen assembly as defined in claim 21 wherein said electrodes are located between layers of said dielectric element.

27. A method for clamping a workpiece during processing, comprising the steps of:
   providing a platen assembly comprising a dielectric element that defines an electrically-insulating clamping surface and electrodes underlying said clamping surface, said electrodes comprising a plurality of sealing electrodes;
   mounting a workpiece on said clamping surface;
   introducing a gas into a region between the workpiece and said clamping surface; and
   applying time-varying voltages to said sealing electrodes to produce in the workpiece or said clamping surface a moving wave for transporting the gas.

28. A method as defined in claim 27 wherein the step of providing a platen assembly includes providing at least three sealing electrodes at or near a periphery of said clamping surface.

29. A method as defined in claim 28 wherein the step of applying voltages includes producing an inwardly moving wave in the workpiece, wherein the gas is transported inwardly away from the periphery of said clamping surface by said inwardly moving wave.

30. A method as defined in claim 27 wherein the step of providing a platen assembly further comprises providing one or more clamping electrodes underlying said clamping surface and further comprising the step of applying clamping voltages to said clamping electrodes for electrostatically clamping the workpiece in a fixed position on said clamping surface.

31. A method as defined in claim 27 wherein the step of applying voltages to said sealing electrodes comprises applying voltages that each include attractive voltage segments and non-attractive voltage segments in a repeating sequence and phasing said voltages such that said attractive voltage segments and said non-attractive voltage segments move from electrode to electrode and define a direction of gas transport.

32. A method as defined in claim 27 wherein the step of applying voltages to said sealing electrodes comprises applying voltages that each include zero voltage segments and non-zero voltage segments in a repeating sequence and phasing said voltages such that said zero voltage segments and said non-zero voltage segments move from electrode to electrode and define a direction of gas transport.

33. Apparatus for holding a workpiece during processing, consisting essentially of:
   a platen assembly comprising a dielectric element that defines an electrically-insulating clamping surface for receiving a workpiece and a plurality of sealing electrodes;
   a gas source for providing a gas in a region between the workpiece and said clamping surface; and
   a voltage source for applying time-varying voltages to said sealing electrodes to produce in the workpiece or said clamping surface a moving wave for transporting the gas.

34. Apparatus for clamping a semiconductor wafer during processing, comprising:
   a platen assembly comprising a dielectric element that defines an electrically-insulating clamping surface for receiving the semiconductor wafer and electrodes underlying said clamping surface, said electrodes comprising three or more concentric sealing electrodes at or near a periphery of said clamping surface, said platen assembly further comprising a conduit for introducing a gas into a region between the semiconductor wafer and said clamping surface;
   a gas source coupled to said conduit for providing the gas in the region between the semiconductor and said clamping surface for conducting thermal energy between the semiconductor wafer and said clamping surface; and
   a voltage source for applying voltages to said sealing electrodes for producing an inwardly moving wave in the semiconductor wafer, wherein the gas is transported inwardly away from the periphery of said clamping surface by said inwardly moving wave, said voltage source generating voltages that each include attractive voltage segment and non-attractive voltage segment in a repeating sequence and wherein said voltages are phased such that said attractive voltage segments and said non-attractive voltage segments move from electrode to electrode and define a direction of gas transport.

* * * * *